(12) United States Patent
Kim

(10) Patent No.: US 6,284,575 B1
(45) Date of Patent: Sep. 4, 2001

(54) METHOD OF MAKING A SEMICONDUCTOR DEVICE HAVING FUSES FOR REPAIR

(75) Inventor: Suk Soo Kim, Kyoungki-do (KR)

(73) Assignee: Hyundai Electronics Industries Co., Ltd., Ichon-shi (KR)

(*) Notice: Subject to any disclaimer, the term of this patent is extended or adjusted under 35 U.S.C. 154(b) by 0 days.

(21) Appl. No.: 09/178,552

(22) Filed: Oct. 26, 1998

(30) Foreign Application Priority Data

Oct. 27, 1997 (KR) .................................. 97-55195

(51) Int. Cl.[7] .................................................. H01L 21/82
(52) U.S. Cl. .................... 438/129; 438/130; 438/132; 438/601
(58) Field of Search ............................. 438/129, 130, 438/132, 601

(56) References Cited

U.S. PATENT DOCUMENTS

| 4,455,194 | 6/1984 | Yabu et al. | 438/601 |
| 5,585,663 | 12/1996 | Bezama et al. | 257/529 |
| 5,821,160 | * 10/1998 | Rodriguez et al. | 438/601 |
| 5,891,762 | * 4/1999 | Sakai et al. | 438/132 |

FOREIGN PATENT DOCUMENTS 9-74137    3/1997   (JP) .

* cited by examiner

Primary Examiner—John F. Niebling
Assistant Examiner—Lynne Gurley
(74) Attorney, Agent, or Firm—Jacobson Holman, PLLC

(57) ABSTRACT

A method of making a semiconductor device having fuses for repair, using a etch stop film to form an insulating film having a constant thickness. The etch stop film is patterned and then removed. Remaining portions of the insulating film have a constant thickness for each fuse box, thereby improving fabricating process yield and reliability.

2 Claims, 4 Drawing Sheets

METHOD OF MAKING A SEMICONDUCTOR DEVICE HAVING FUSES FOR REPAIR

BACKGROUND OF THE INVENTION

1. Field of the Invention

The present invention relates to a method of fabricating a semiconductor device, and more particularly to a method of fabricating a semiconductor device which has a fuse box and uses an etch stop film, so that an insulating film left on the fuse box can have a constant thickness.

2. Description of the Prior Art

In general, the process yield of the semiconductor device can be improved upon fabricating extra lines to replace row and column lines to prevent the entire chip from failing when one cell from row and column lines in the semiconductor device fails. The process yield can also be improved by providing a plurality of fuse boxes having a plurality of fuses to replace inferior lines, and utilizing a repair method to be connected to a new line by cutting the fuse connected to the corresponding line.

On the other hand, in the case of forming a multiple layer in the semiconductor device, the thick insulating films are formed on the fuse boxes by the following process. In general, the fuse is to be connected, for example, by a bit line or a word line formed on the semiconductor substrate. It is necessary to maintain a constant thickness on the insulating film on the surface of the the fuse box, because a cutting process performs exactly at the fuses which connect with the failed lines after completing the repair process and testing of the chip of the semiconductor device.

In addition, the number of layers in a metal wiring layer increases due to the semiconductor device gradually becoming of higher integration. As a result, the thickness of the insulating film on the fuse box increases.

Furthermore, the thickness of the insulating film on the fuse box differs according to its location in the chip. The difference in thickness makes accurately cutting the fuse at the fuse box impossible during the repair process.

FIG. 1 shows a lay-out view of a general fuse box, where a plurality of fuses 2 are arranged in fuse box 4.

FIG. 2 is a sectional view showing a state of the fuse box, after completing the semiconductor device according to the prior art, which is shown according to line A—A of FIG. 1.

Provided is a conductive layer used as a fuse 11 on a lower insulating film 10. An upper insulating film 13 will become thicker by the next process, and the upper insulating film 13 formed on fuse box is removed to carry out the repairing process until the upper insulating film 13 on the fuse 11 remains a constant thickness B. In addition, if the fuse 11 is exposed to the atmosphere, it will corrode; thus, the surface of the fuse must have a constant thickness for the insulating film.

Therefore, there are no problems if the insulating film on the fuse remains even in the whole chip, but there is a problem when the process yield of fabricating the semiconductor device decreases, which is brought about by the interior repairing process where the fuse is not completely cut. Since the difference in thickness is dependant upon the location of chip, the remaining insulating film is not removed completely.

SUMMARY OF THE INVENTION

Therefore, an object of the invention is to solve the above-mentioned problems involved in the conventional method of fabricating a semiconductor device and to provide a method of fabricating a semiconductor device, with which the etch stop film on the fuse box is formed, and the process of the semiconductor device is accomplished. In the final step, the insulating film on the fuse box maintains a constant thickness by the etching process which removes the upper insulating film and the etch stop film.

In accordance with one aspect of the present invention, a method is provided of fabricating a semiconductor device having fuses for repair which comprises the steps of:

forming an intremediate insulating film on an entire structure comprising a plurality of fuse boxes in which a plurality of fuses are provided;

forming an etch stop film pattern on the intermediate insulating film on the fuse boxes;

forming an upper insulating film;

etching the upper insulating film on the fuse boxes to expose the etch stop film pattern; and removing the exposed the etch stop film pattern, whereby the intermediate insulating film with a constant thickness remains for each of the fuse boxes.

The etch stop film consists of either a conductive layer or an insulating film that has a different etch selectivity from that of the intermediate insulating film.

An additional feature of the present invention is the etch stop film which forms in the fuse box.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Hereinafter, a method of fabricating a semiconductor device according to the present invention will be explained in detail according to the attached drawings.

FIG. 3 through FIG. 6 are sectional views showing the process of fabricating a semiconductor device according to the present invention.

Figure 7:
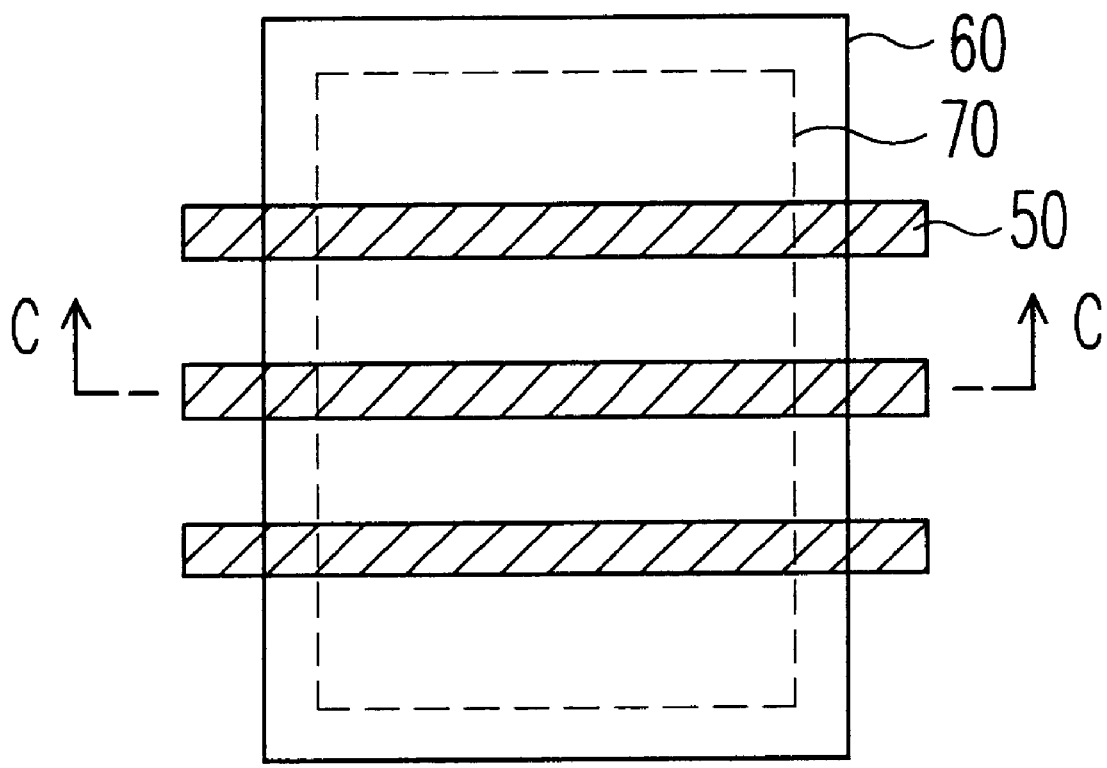
FIG. 7 is a lay-out view of a fuse box used in the present invention.

FIG. 7 is a lay-out view of a fuse box used in the present invention, showing a plurality of fuses 50, a fuse box 70, and an etch stop film pattern 60.

Figure 1:
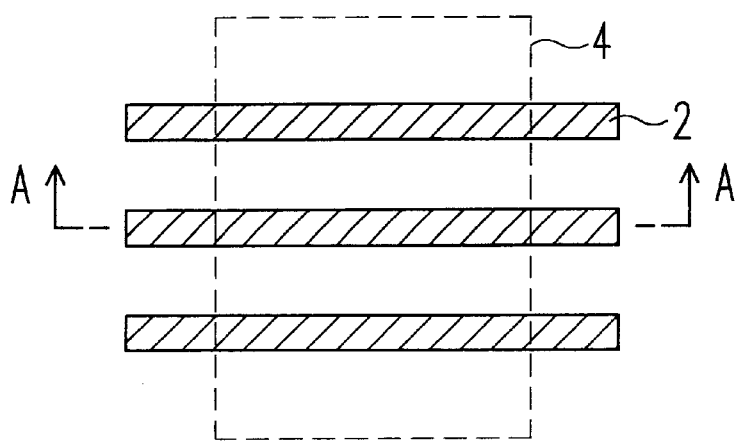
FIG. 1 is a lay-out view of a fuse box used in the prior art.
Figure 2:
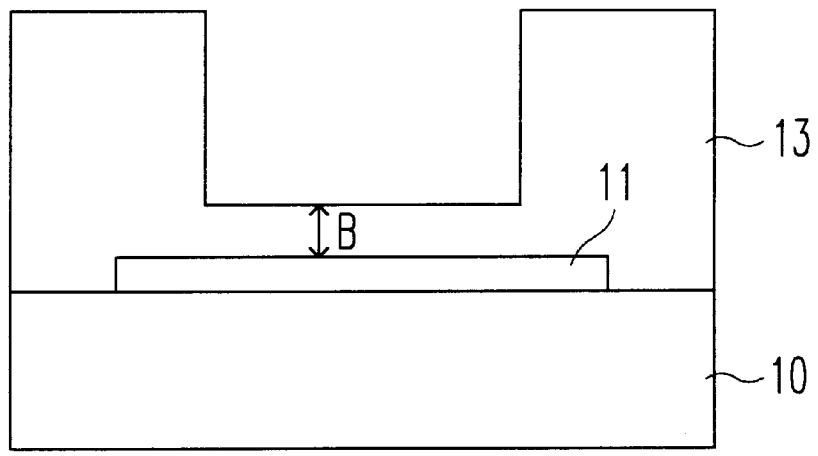
FIG. 2 is a sectional view according to line A—A of FIG. 1.
Figure 3:
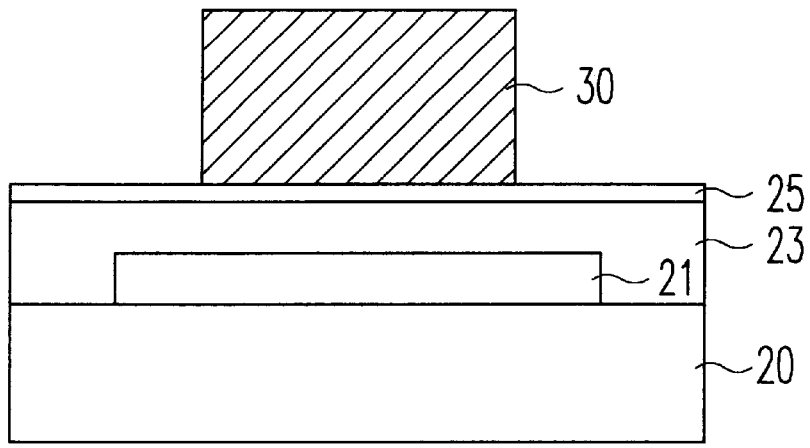
FIG. 3 through FIG. 6 are sectional views according to line C—C of FIG. 7; showing steps of fabricating a semiconductor device according to a method of the present invention.

As shown in FIG. 3, a sectional view shows a fuse 21 made of the conductive layer on a lower insulating film 20, an intermediate insulating film having an etch selectivity 23, and an etch stop film 25 comprising either a conductive film or an insulating film different from the etching selectivity of the lower insulating film 23, a photoresist film coated thereon, and a photoresist film pattern 30 for an etching stop film pattern by the exposure and developing process.

On the other hand, Tetra Ethyl Ortho Silicate, TEOS, can be used as the etch stop film 25. Furthermore, the fuse 21 can be fabricated simultaneously while manufacturing a bit line or a word line.

Figure 4:
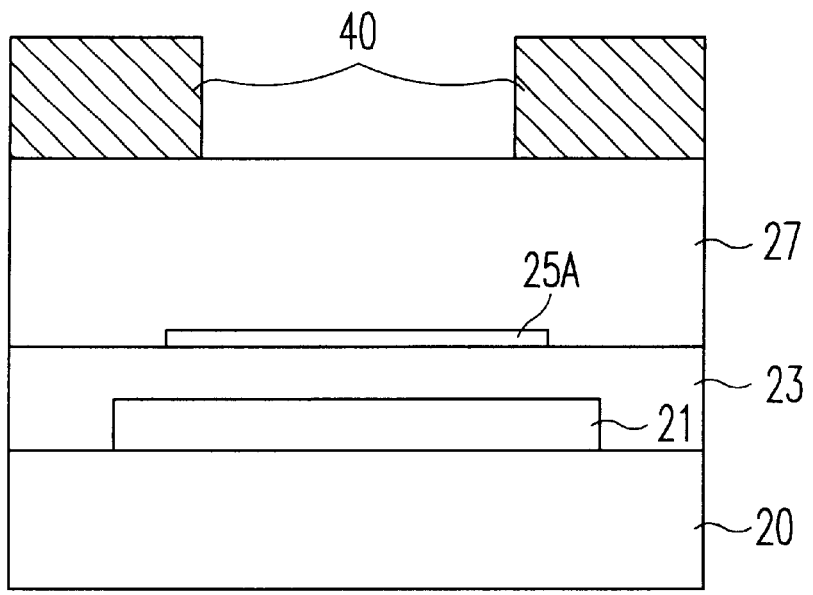

With reference to FIG. 4, using the photoresist film pattern 30 to etch the exposed etch stop film 25, an etch stop film pattern 25A is formed. An upper insulating film 27 is formed on the etch stop film pattern 25A after removing the photoresist film pattern 30. At this time, the upper insulating film 27 may comprise a plurality of insulating films formed in the next process.

Furthermore, it is shown that the photoresist film is coated on the upper insulating film. A photoresist film pattern 40 is formed in the exposure and developing process by utilizing the fuse box mask.

Any material, for example, BPSG(Boro-Phospho-Silica-Glass), PSG(Phospho-Silca-Glass), BSG(Boro-Silica-Glass), or SOG(Spin On Glass), that has a higher etch selectivity than that of the etch stop film 25 maybe used as the upper insulating film 27.

The fuse box mask can be used as the plate mask, but depending on the circumstances, a new mask can be used to form the fuse box.

Figure 5:
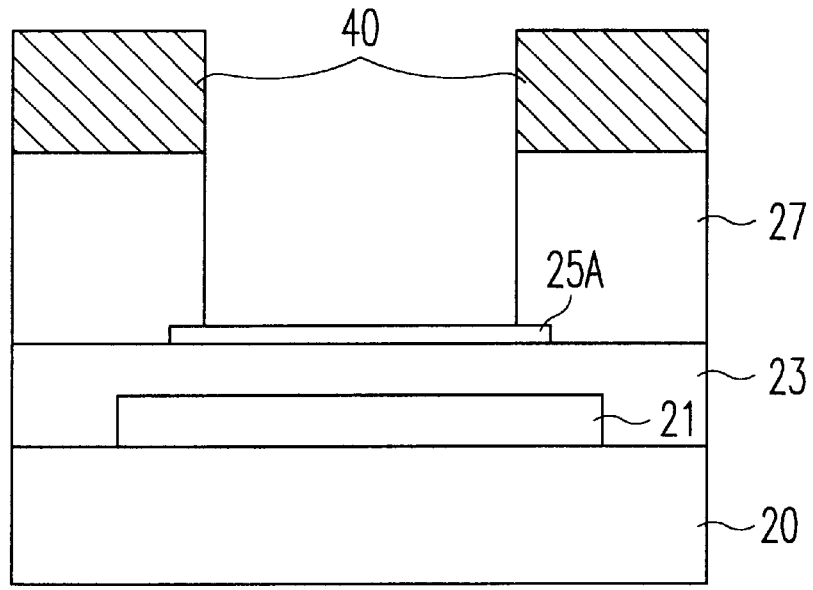

Referring to FIG. 5, the upper insulating film 27 is removed to expose the etch stop film pattern 25A.

Figure 6:
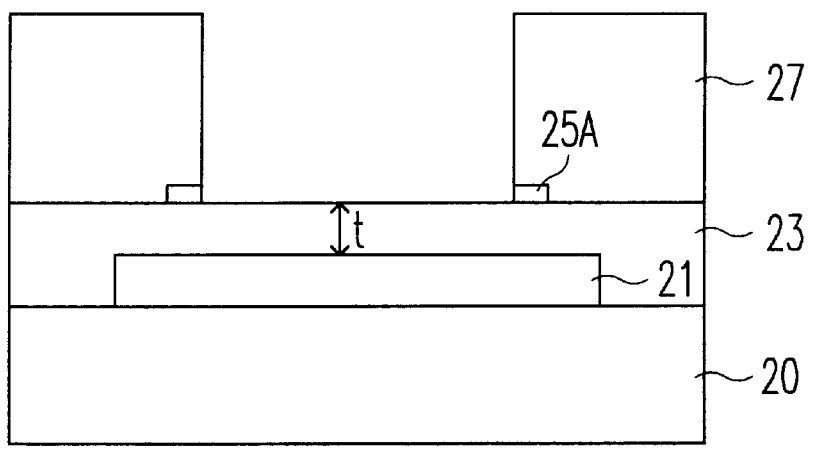

Referring to FIG. 6, it is shown that a constant thickness t is maintained so that only the intermediate insulating film 23 can be left on the fuse 21 of the fuse box by removing the photoresist pattern 40 and the etch stop film pattern 25A.

At this time, the thickness of the intermediate insulating film remains constant on each fuse. Therefore, the desired fuse can be cut accurately using a laser during the repair process.

As described above, according to a method of the present invention, an intermediate insulating film is formed on the fuse box and the etch stop film is formed thereon, and an upper insulating film is formed by the next process. Thereafter, the upper insulating film and the etch stop film on the fuse box are removed as the last process of the semiconductor device. As a result, the productivity of the semiconductor device can be improved.

Although the preferred embodiments of the invention have been disclosed for illustrative purposes, those skilled in the art will appreciate the various modifications, and possible additions and substitutions, wich may be made without departing from the scope and spirit of the invention as disclosed in the accompanying claims.

What is claimed is:

1. A method of fabricating a semiconductor device having fuses for repair comprising the steps of:

forming a lower insulating film on a semiconductor substrate;

forming a plurality of fuses on said lower insulating film;

forming an intermediate insulating film on a resulting structure;

using TEOS film to form an etch stop film on said intermediate insulating film;

forming an etch stop film pattern by etching said etch stop film with an etch mask which exposes a larger area than that of a predetermined fuse box;

forming an upper insulating film on a resulting structure;

forming a plurality of fuse boxes by etching said upper insulating film with an etch mask which exposes an area of a defined fuse box in order to expose at least a portion of said etch stop film pattern; and removing said exposed portion of said etch stop film pattern, whereby a remaining intermediate insulating film has a constant thickness for each of said plurality of fuse boxes.

2. The method according to claim 1, wherein an etch selectivity of said etch stop film pattern is different from an etch selectivity of said intermediate insulating film.

* * * * *